United States Patent
Weng et al.

(10) Patent No.: US 7,122,893 B2
(45) Date of Patent: Oct. 17, 2006

(54) SEMICONDUCTOR PACKAGE STRUCTURE

(75) Inventors: Gwo-Liang Weng, Kaohsiung (TW); Ching-Hui Chang, Kaohsiung (TW); Yung-Li Lu, Linyuan Township, Kaohsiung County (TW); Yu-Wen Chen, Kaohsiung (TW)

(73) Assignee: Advanced Semiconductor Engineering, Inc., Kaohsiung (TW)

( * ) Notice: Subject to any disclaimer, the term of this patent is extended or adjusted under 35 U.S.C. 154(b) by 42 days.

(21) Appl. No.: 10/920,077

(22) Filed: Aug. 17, 2004

(65) Prior Publication Data

US 2005/0051885 A1    Mar. 10, 2005

(30) Foreign Application Priority Data

Aug. 19, 2003    (TW) ............................. 92122797 A

(51) Int. Cl.
H01L 23/04        (2006.01)
(52) U.S. Cl. .............. 257/730; 257/777; 257/786; 257/686; 438/110
(58) Field of Classification Search ............... 257/791, 257/778–780, 737–738, 777, 686, 795; 438/613–617
See application file for complete search history.

(56) References Cited

U.S. PATENT DOCUMENTS

| | | | |
|---|---|---|---|
| 6,133,065 A * | 10/2000 | Akram | 438/108 |
| 6,433,412 B1 * | 8/2002 | Ando et al. | 257/678 |
| 6,573,592 B1 * | 6/2003 | Bolken | 257/687 |
| 6,657,311 B1 * | 12/2003 | Hortaleza et al. | 257/778 |
| 6,759,745 B1 * | 7/2004 | Masumoto et al. | 257/730 |
| 6,777,797 B1 * | 8/2004 | Egawa | 257/686 |
| 2003/0111720 A1 * | 6/2003 | Tan et al. | 257/686 |

* cited by examiner

Primary Examiner—Mary Wilczewski
Assistant Examiner—Tsz Chiu
(74) Attorney, Agent, or Firm—Thomas, Kayden, Horstemeyer & Risley

(57) ABSTRACT

A semiconductor package structure includes a semiconductor component, a substrate, solder bumps, underfill, a buffer means, and solder balls. The substrate is under the semiconductor component. A joint area is formed between the first surface of the semiconductor and the upper surface of the substrate. Several solder bumps are disposed in the joint area, for electrically connecting the semiconductor component and the substrate. The underfill is filled in the joint area, for coating the solder bumps and tightly jointing the semiconductor component and the substrate. The buffer means is situated in the jointing area, for buffering the underfill to be confined in the joint area. Several solder balls are disposed on the lower surface of the substrate.

20 Claims, 5 Drawing Sheets

SEMICONDUCTOR PACKAGE STRUCTURE

This application claims the benefit of Taiwan application Serial No. 92122797, filed Aug. 19, 2003, the subject matter of which is incorporated herein by reference.

BACKGROUND OF THE INVENTION

1. Field of the Invention

The invention relates in general to a semiconductor package structure, and more particularly to a semiconductor package structure formed by flip chip jointing technique.

2. Description of the Related Art

In the past few years, as the electronic products are developed toward being thin and small, multi-functioned, and high-speed, high-density and high input/output semiconductor package structures are required increasingly. For this reason, the flip chip package structure is now widely applied in the high-performance products and portable electronic products. In addition that the interface jointing paths can be reduced in the flip chip package technique to provide an excellent electrical feature, the whole package structure scale can be reduced meanwhile the multi-input/output pins requirement can be achieved by a suitable chip layout.

In the flip chip package structure, the surface of the chip, having solder bumps is directed to the substrate and the chip is jointed to the substrate directly via the bumps, different from the conventional wire bonding or tape automated bonding (TAB). The present flip chip jointing technique is mostly applied in the flip chip on board (FCOB), in which the chip is directly disposed on the substrate, or the flip chip in package (FCIP), which collocates the package structure CSP, BGA, or MCM, such as FC-CSP, FC-BGA, or FC-MCM.

Referring to FIG. 1, a lateral view of the conventional flip chip package structure is shown. Several solder bumps 104 are disposed on the first surface 102a, and form as bonding joints in the solder reflow process to electrically couple the semiconductor component 102 and the substrate 106. Solder balls 108 are disposed on the lower surface 106b of the substrate 106 for electrically coupling the flip chip package structure and the exterior circuits. The stress generated at the bonding joints for the flip chip expands when hot and shrinks when cold will damage the joints and reduce the reliability on the bonding of the semiconductor component 102 and the substrate 106. Therefore, an underfill process is generally used to fill underfill 110 in the region between the semiconductor component 102 and the substrate 106. By using the underfill 110 to tightly joint the semiconductor component 102 and the substrate 106, the stress at joints can be reduced as scattered to the underfill 110, and the ability of resisting the thermal fatigue at the joints can be improved.

In the conventional underfill process, the underfill 110 is filled in through one side or two sides of the semiconductor component 102, and distributed between the semiconductor component 102 and the substrate 106 by capillarity. Therefore, the upper surface of the substrate 106, contacting with the underfill, has to be larger than the lower surface of the semiconductor component 102 contacting with the underfill. That is, the area of the substrate 106 surrounded by the side surfaces 106p is larger than the area of the semiconductor component 102 surrounded by the side surface 102p, so the substrate 106 can provide enough space for the underfill flow. After the underfill 110 coats all the solder bumps 204 and fills in the region between the semiconductor component 102 and the substrate 106, and a part of the side surfaces 102p, the flip chip package structure 100 is put in an oven where the underfill is heated for solidification. However, in the process as the underfill is flowing or is being heated, the underfill will usually overflow and pollute the substrate 106. Especially when the size of the substrate is limited, such as the upper surface of the substrate is limited about equal to the lower surface of the semiconductor, in the process as the underfill is flowing or being heated, the substrate can not provide enough space for the underfill to flow. Therefore, the underfill will overflow to pollute the substrate, or even overflow to the solder balls on the lower surface of the substrate, thereby damaging the whole product.

Referring to FIG. 2, a lateral diagram of another conventional flip chip package structure is shown. The flip chip package structure 200 includes a semiconductor component 202, solder bumps 204, a substrate 206, solder balls 208, underfill 210 and dams 212. As shown in FIG. 2, several solder bumps 204 are disposed on the first surface 202a of the semiconductor component 202. The solder bumps 204 are jointed to the first surface 202a in the solder reflow process so that the first surface 202a of the semiconductor component 202 can be electrically coupled to the upper surface 206a of the substrate 206 via these solder bumps. The underfill 210 is used for coating the solder bumps 204 and tightly jointing the semiconductor component 202 and the substrate 206. The dam 212 projects from the upper surface 206a of the substrate 206. Due to the dam design, in the underfill process when the underfill 210 is filled in the region between the semiconductor component 202 and the substrate 206, and a part of the side surfaces 202p, the underfill overflow issue can be solved through the blocking of the dams 212.

However, in FIG. 2, in addition that the upper surface 206a of the substrate 206 has to be larger than the first surface 202a of the semiconductor component 202, the inner surface 212p of the dam 212 has to be outside the area on the substrate 206 projected by the first surface 202a of the semiconductor component 202, so that the substrate 206 can provide enough space for the underfill 210 flow. As a result, when a vertical view of the second surface 202b of the semiconductor 202 is taken, the underfill 210 and the dams 212 can be seen to surround the semiconductor component 202 layer by layer, which will influence the appearance of the flip chip package structure 200. Moreover, for the dams has to project from the substrate 206, which will increase the size of the substrate 206, such design cannot be applied to the flip chip package structure in which the lower surface of the semiconductor is almost equal to the upper surface of the substrate.

SUMMARY OF THE INVENTION

It is therefore an object of the invention to provide a semiconductor package structure. The semiconductor package structure has a buffer means design for the underfill filled in between the semiconductor component and the substrate. Therefore, the underfill amount can be controlled accurately and the underfill overflow issue can be avoided.

The invention achieves the above-identified object by providing a semiconductor package structure including a semiconductor component, a substrate, several solder bumps, underfill, a buffer means, and solder balls. The semiconductor component has a first surface, and the substrate, located under the semiconductor, has an upper surface and a lower surface. A jointing area is formed between the first surface of the semiconductor component and the upper surface of the substrate. Several solder bumps are disposed in the jointing area for electrically coupling the semiconductor component and the substrate. The underfill, filled in the jointing area, coats the solder bumps and tightly joints the semiconductor component and the substrate. The buffer means is disposed in the jointing area for buffering the underfill to be confined in the jointing area. Several solder balls are disposed on the lower surface of the substrate.

Other objects, features, and advantages of the invention will become apparent from the following detailed description of the preferred but non-limiting embodiments. The following description is made with reference to the accompanying drawings.

DETAILED DESCRIPTION OF THE INVENTION

The spirit of the semiconductor package structure in the invention lies on the buffer means design for the underfill filling. By designing a buffer means at the joints of the semiconductor component and the substrate to buffer and control the filling of underfill, the filling amount of underfill can be controlled accurately. The FCOB or the FCIP, including CSP, BGA, and MCM, can be applied to the semiconductor package structure of the invention. The FCOB is applied as the semiconductor component is a chip, while the FCIP is applied as the semiconductor component is a package structure.

Figure 1:
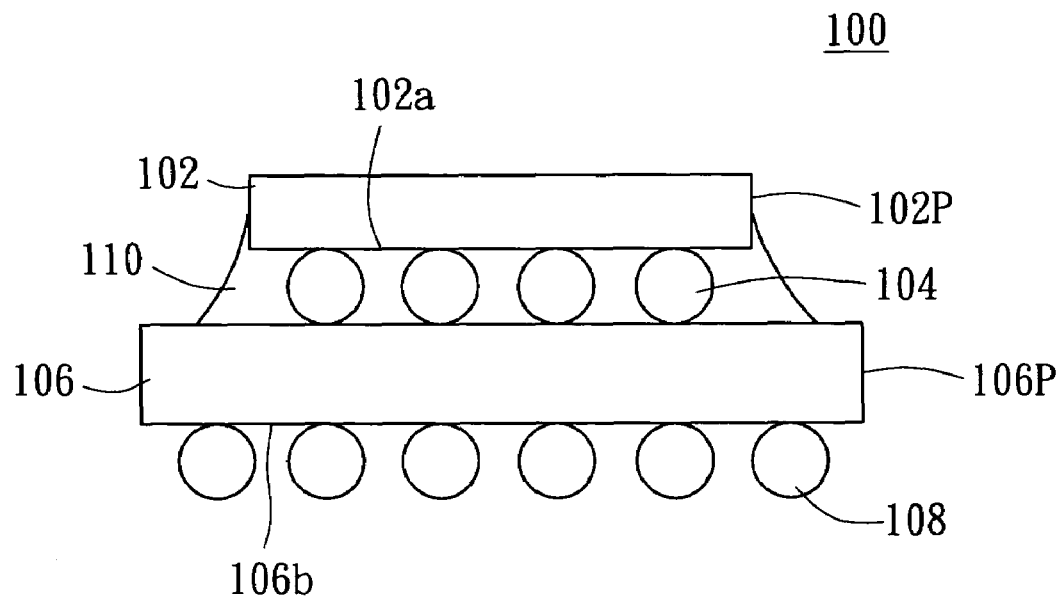
FIG. 1 is a lateral view of the conventional flip chip package structure.
Figure 2:
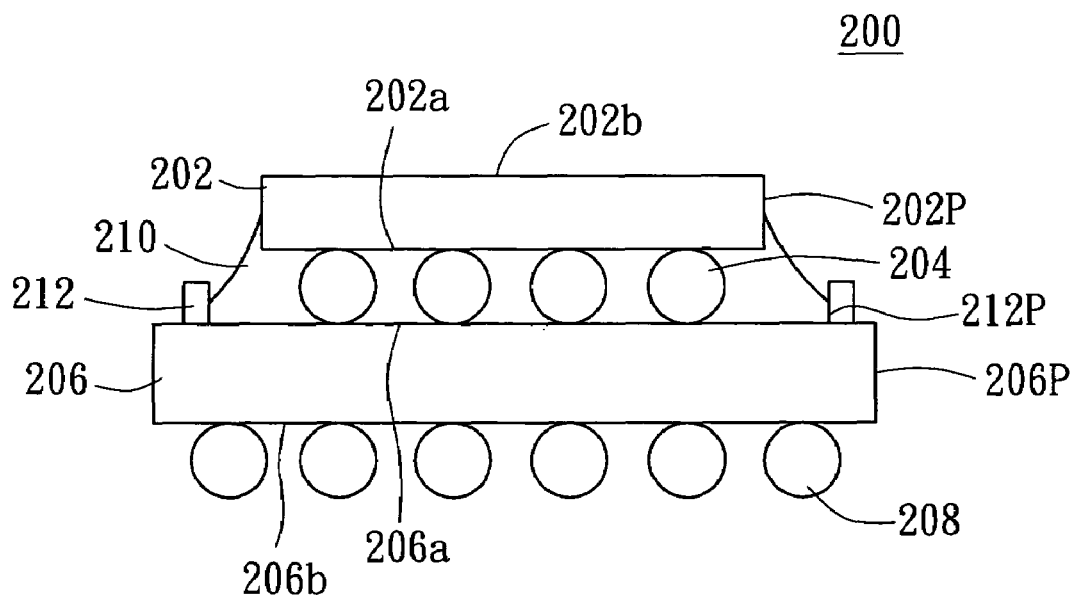
FIG. 2 is a lateral diagram of another conventional flip chip package structure.
Figure 3:
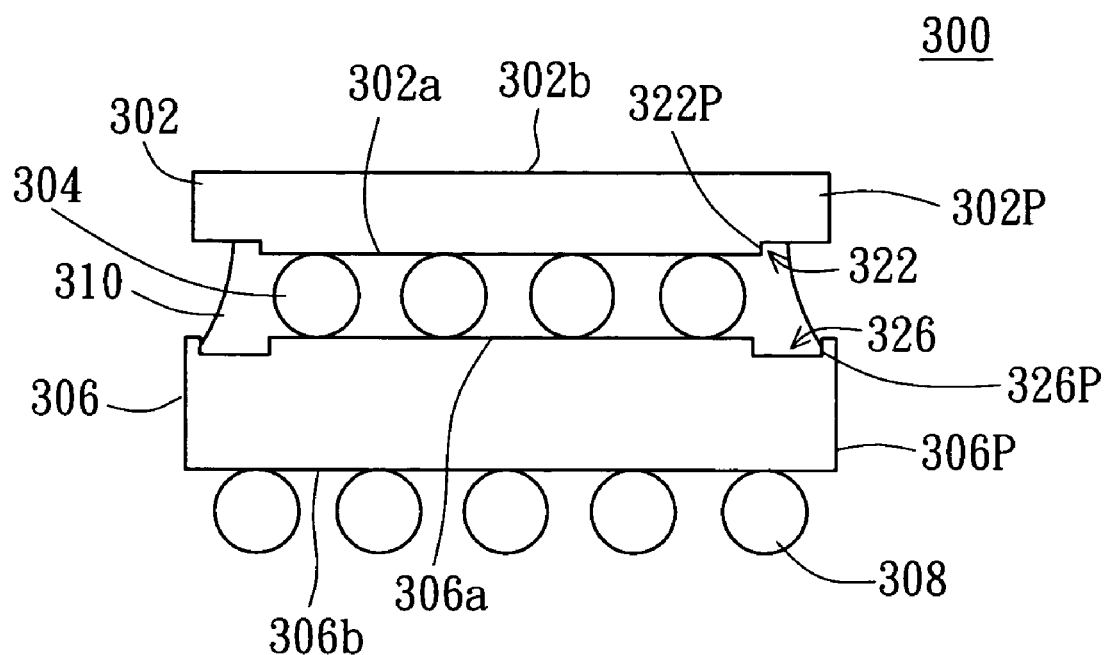
FIG. 3 is a schematic diagram of semiconductor package structure according to a first preferred embodiment of the invention.

Referring to FIG. 3, a schematic diagram of the semiconductor package structure according to a first preferred embodiment of the invention is shown. The semiconductor package structure includes a semiconductor component 302, a substrate 306, several solder bumps 304, underfill 310, cut indents 322, grooves 326 and several solder balls 308. As shown in FIG. 3, the semiconductor component 302 has a first surface 302a, and the substrate 306, located under the semiconductor component 302, has an upper surface 306a and a lower surface 306b. A jointing area is formed between the first surface 302a of the semiconductor 302 and the upper surface 306a of the substrate 306. Several solder bumps 304 are disposed in the jointing area for electrically coupling the semiconductor component 302 and the substrate 306. The underfill 310, filled in the jointing area, coats the solder bumps 304 and tightly joints the semiconductor component 302 and the substrate 306. Several solder balls 308 are disposed on the lower surface 306b of the substrate 306. The first side surface 302p of the semiconductor component 302 has a first circumference, and the second side surface 306p of the substrate 302 has a second circumference.

Figure 5A:
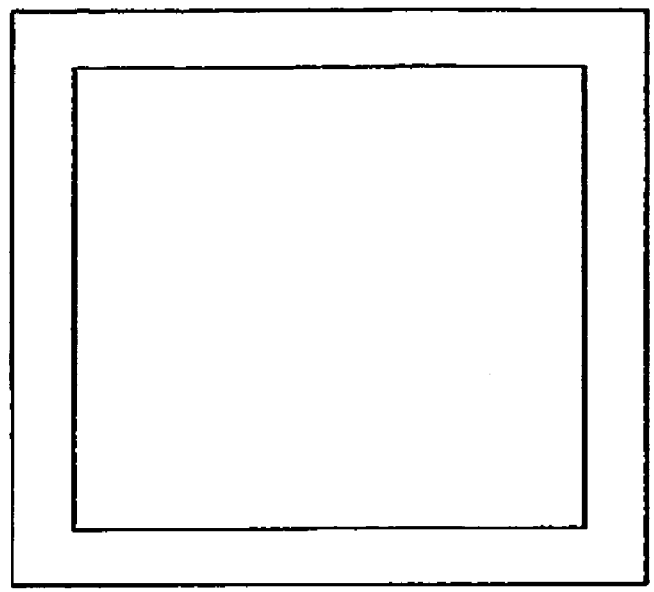
FIG. 5A is a bottom view of the semiconductor component, which has a rectangle cut indent.
Figure 5B:
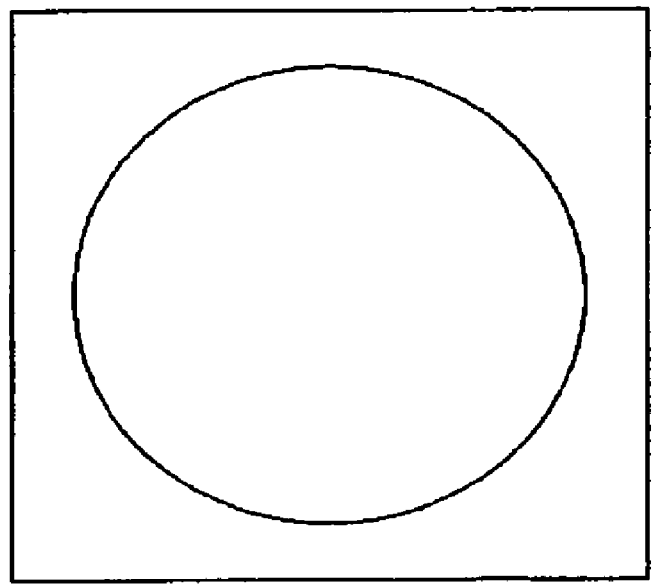
FIG. 5B is a bottom view of the semiconductor component, which has a circular cut indent.
Figure 6A:
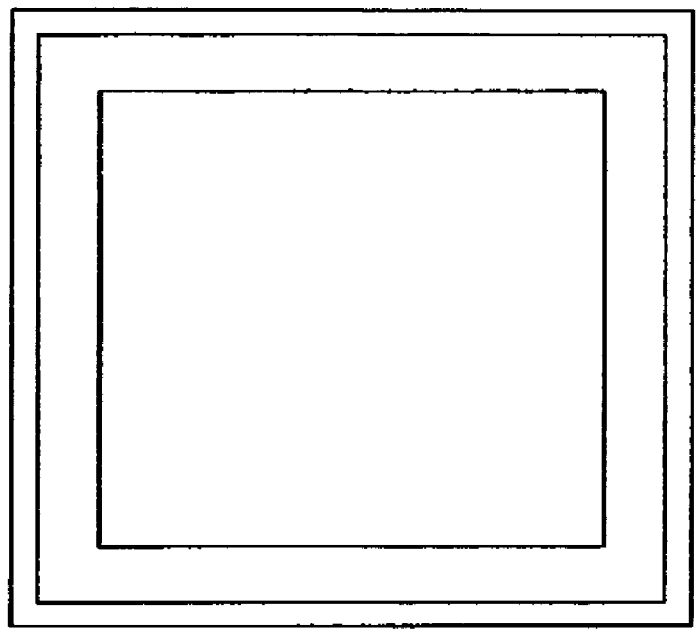
FIG. 6A is a top view of the substrate, which has a rectangle groove.
Figure 6B:
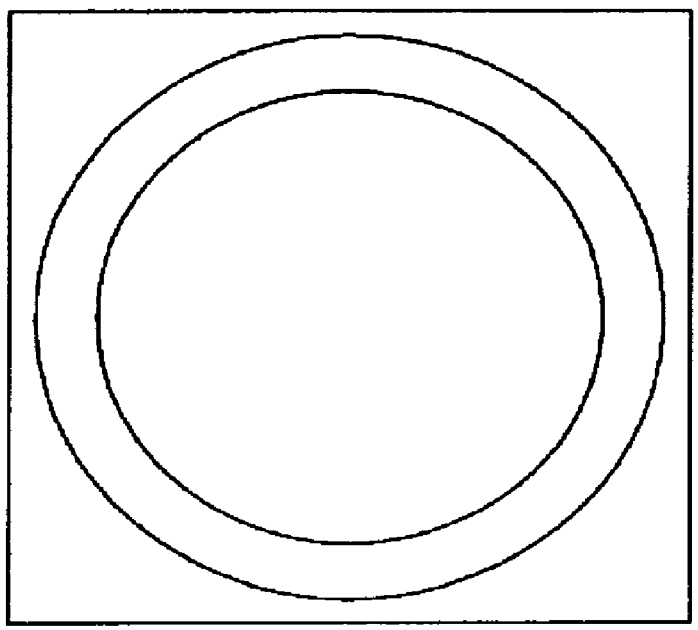
FIG. 6B is a top view of the substrate, which has a circular groove.

In the first embodiment, the buffer means design is the combination of the cut indent 322 and the groove 326. The cut indent 322 is disposed at the turning part of the semiconductor component 302 from the first surface 302a to the first side surface 302p, and the groove 326 is disposed on the upper surface 306a of the substrate 306. As shown in FIG 3, the cut indent 322 forms a sidewalk 322p, located within the first circumference, on the semiconductor component 302. The groove 326 forms a blocking wall 326, located within the second circumference, on the substrate 306. In the underfill process, the underfill 310 flows between the semiconductor component 302 and the substrate 306 by capillarity. It can be seen clearly if the underfill 310 flows into the groove 326 of the buffer means, so the underfill flowing can be observed easily and the underfill amount can be controlled thereby. The buffer means in the first embodiment can be the combination of a rectangle cut indent in FIG. 5A and a rectangle groove in FIG. 6A, or the combination of a circular cut indent in FIG. 5B and a circular groove in FIG. 6B. In order to provide enough space for the underfill flow, the blocking wall 326p of the groove 326 has to be located outside of the sidewalk 322p of the cut indent 322.

Although the buffer means having the cut indent 322 and the groove 326 is taken as an example in the first embodiment, the buffer means of the invention can also be a combination of a stepper formed on the first surface 302a of the semiconductor component 302 and a cavity disposed on the upper surface 306a of the substrate 306. As long as the underfill amount can be controlled by observing the underfill flowing to the cavity, it will not be apart from the spirit of the invention.

In addition, the blocking wall 326p is located within the first circumference, so the underfill 310 and the buffer means of the invention will not be seen to surround the semiconductor component 302 as a vertical view of the second surface 302b of the semiconductor component 302 is taken, after the underfill is heated for solidification. Especially, when the first side surface 302p and the second side surface 306p are located approximately at the same plane, not only the appearance of the flip chip package structure 300 can have a unity and a tidy shape, but the substrate can also provide enough space for the underfill 310 flow thereby preventing the underfill overflow under the limited size of the substrate 306.

Figure 4:
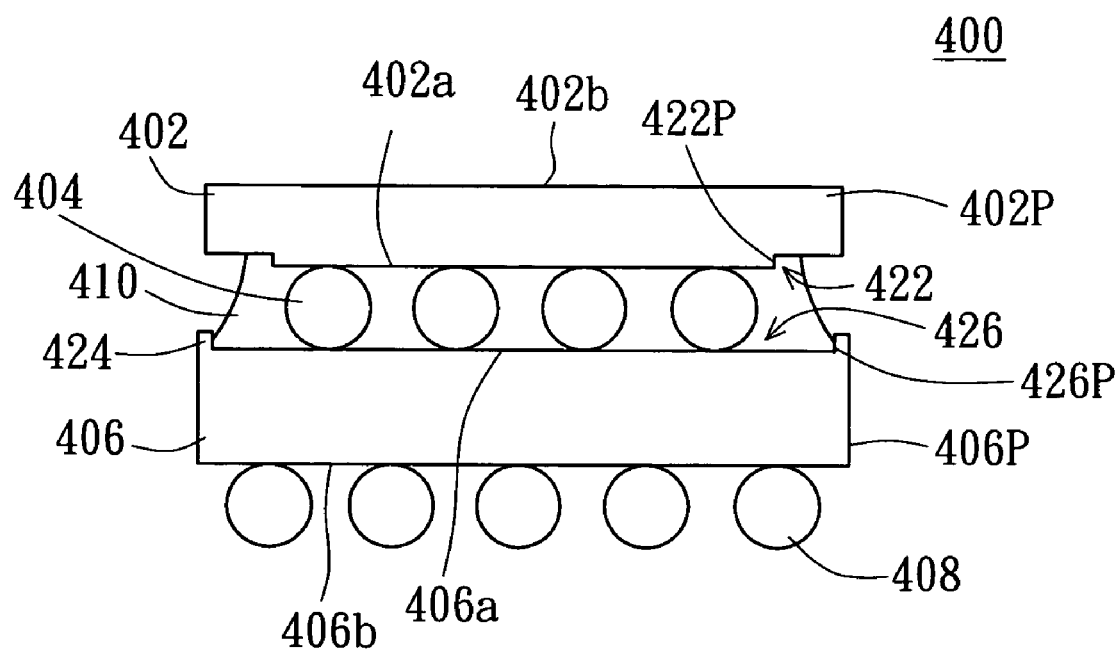
FIG. 4 is a schematic diagram of the semiconductor package structure according to a second preferred embodiment of the invention.

Referring to FIG. 4, a schematic diagram of the semiconductor package structure according to a second preferred embodiment of the invention is shown. The semiconductor package structure includes a semiconductor component 402, a substrate 406, several solder bumps 404, underfill 410, cut indents 422, blocking bumps 424, and several solder balls 408. As shown in FIG. 4, the semiconductor component 402 has a first surface 402a, and the substrate 406, located under the semiconductor component 402, has an upper surface 406a and a lower surface 406b. A jointing area is formed between the first surface 402a of the semiconductor component 402 and the upper surface 406a of the substrate 406. Several solder bumps are disposed in the jointing area for electrically coupling the semiconductor component 402 and the substrate 406. The underfill 410, filled in the jointing area, coats the solder bumps and tightly joints the semiconductor component 402 and the substrate 406. The first side surface 402p of the semiconductor component 402 has a first circumference and the second side surface 406p of the substrate 402 has a second circumference.

Figure 7A:
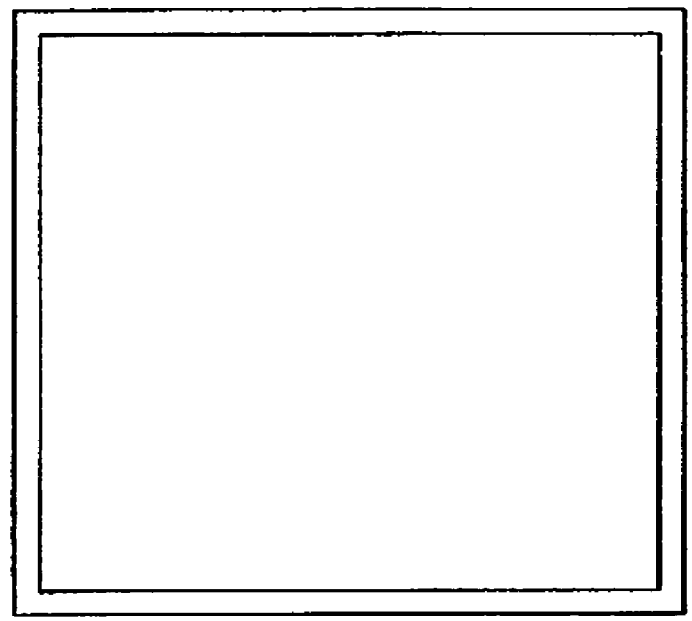
FIG. 7A is a top view of the substrate, which has a rectangle blocking bump.
Figure 7B:
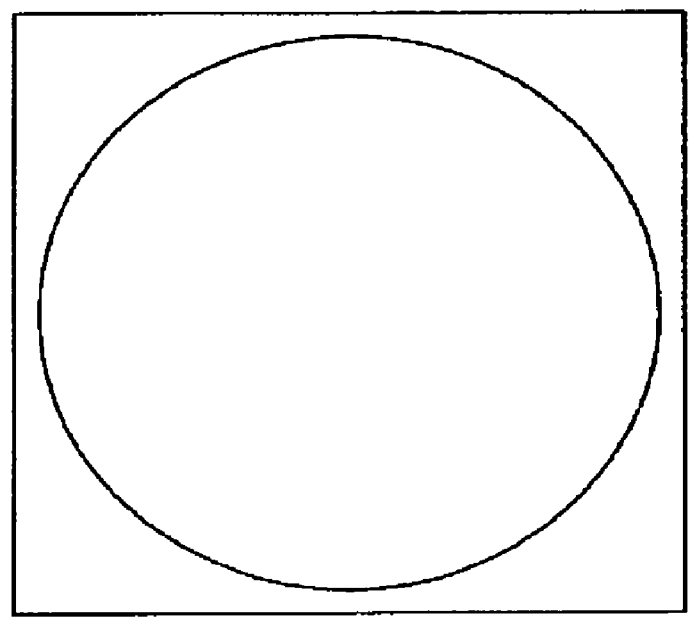
FIG. 7B is a top view of the substrate, which has a circular blocking bump.

In the second embodiment, the butler means is the combination of the cut indent 422 and the blocking bump 424. The cut indent 422 is disposed at the turning point of the semiconductor component 402 from the first surface 402a to the first side surface 402p, and the blocking bump 424 projects from the upper surface 406a of the substrate 406. As shown in FIG. 4, the blocking bump 424 has a blocking wall 426p, located within the second circumference. In order that the substrate 406 can provide enough space for the underfill flow, the blocking wall 426p of the blocking bump 424 has to be located outside of the sidewalk 422p of the cut indent 422. The buffer means in the second embodiment can be the combination of a rectangle cut indent in FIG. 5A and a rectangle blocking bump in FIG. 7A, or be the combination of a circular cut indent in FIG. 5B and a circular blocking bump in FIG. 8. When the cut indent 422 is a circular one, the circular blocking bump 424 looks like forming a rectangular groove 426 at the center part of the substrate 406. Therefore, the buffer means can also be the combination of the circular cut indent in FIG. 5B and a rectangle groove in FIG. 6A.

In addition, the blocking wall 426 is designed to be located within the first circumference, so the underfill 410 surrounding the semiconductor component 402 and the buffer means of the invention cannot be seen as a vertical view at the second surface 402b of the semiconductor component 402 is taken after the underfill is heated for solidification. When the first side surface 402p and the second side surface 406p are located at the same plane, not only the appearance of the flip chip package structure 400 can have a unity and a tidy shape, but the substrate can also provide enough space for the underfill 410 flow, thereby preventing the underfill overflow under the limited size of the substrate 406.

The semiconductor package structure has a buffer means for the fill of underfill, which can control the amount of the underfill filled in accurately. Especially, when the size of the substrate is limited, the buffer means can provide enough space for buffering the underfill flow. Therefore, the underfill overflow and thus the product damage can be effectively avoided. The buffer means, located between the semiconductor component and the substrate, can even improve the jointing strength of these two elements. Moreover, the appearance of the flip chip package structure can maintain a unity and a tidy shape, thereby improving its beautiful exterior.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A semiconductor package structure, comprising:
   a semiconductor component, having a first surface and a first side surface, the first side surface having a first circumference;
   a substrate, having an upper surface, a second side surface and a lower surface, the substrate located under the semiconductor component, the second side surface having a second circumference wherein a jointing area is formed between the first surface of the semiconductor component and the upper surface of the substrate;
   a plurality of solder bumps, disposed in the jointing area, for electrically coupling the semiconductor component and the substrate;
   underfill, filled in the jointing area, for coating the solder bumps and jointing the semiconductor component and the substrate; and
   a buffer means, disposed in the jointing area, for buffering the underfill to be confined in the jointing area, the buffer means comprising:
   a cut indent, disposed at a turning part of the semiconductor component from the first surface to the first side surface, wherein the cut indent forms a sidewall on the semiconductor component, and the sidewall is located within the first circumference; and
   a groove, disposed on the upper surface of the substrate wherein the groove forms a blocking wall on the substrate, and the blocking wall is located within the first circumference and located outside of the sidewall.

2. The package structure according to claim 1, wherein the cut indent is a rectangle cut indent.

3. The package structure according to claim 2, wherein the groove is a rectangle groove.

4. The package structure according to claim 1, wherein the cut indent is a circular cut indent.

5. The package structure according to claim 4, wherein the groove is a circular groove.

6. The package structure according to claim 4, wherein the groove is a rectangle groove.

7. The package structure according to claim 1, wherein the first side surface and the second side surface are approximately at the same plane.

8. The package structure according to claim 1, wherein the length and the width of the semiconductor component is substantially equal to the length and the width of the substrate.

9. The package structure according to claim 1, wherein the underfill is fully covered by the semiconductor component.

10. The package structure according to claim 1, further comprising a plurality of solder balls disposed on the lower surface of the substrate.

11. A semiconductor package structure, comprising:
    a semiconductor component, having a first surface and a first side surface, the first side surface having a first circumference;
    a substrate, having an upper surface, a second side surface and a lower surface, the substrate located under the semiconductor component, the second side surface having a second circumference, wherein a jointing area is formed between the first surface of the semiconductor component and the upper surface of the substrate;
    a plurality of solder bumps, disposed in the jointing area, for electrically coupling the semiconductor component and the substrate;
    underfill, filled in the jointing area, for coating the solder bumps and jointing the semiconductor component and the substrate; and
    a buffer means, disposed in the jointing area, for buffering the underfill to be confined in the jointing area, wherein the buffer means comprises:
    a cut indent, disposed at a turning part of the semiconductor component from the first surface to the first side surface, wherein the cut indent forms a sidewall on the semiconductor component and the sidewall is located within the first circumference; and a blocking bump, projecting from the upper surface of the substrate, wherein the blocking bump has a blocking wall, located within the first circumference and outside of the sidewall, for blocking the underfill within the jointing area.

12. The package structure according to claim 11, wherein the length and the width of the semiconductor component is substantially equal to the length and the width of the substrate.

13. The package structure according to claim 11, wherein the underfill is fully covered by the semiconductor component.

14. The package structure according to claim 11 further comprising a plurality of solder balls disposed on the lower surface of the substrate.

15. The package structure according to claim 11, wherein the cut indent is a rectangle cut indent.

16. The package structure according to claim 15, wherein the blocking bump is a rectangle blocking bump.

17. The package structure according to claim 11, wherein the cut indent is a circular cut indent.

18. The package structure according to claim 17, wherein the blocking bump is a circular blocking bump.

19. The package structure according to claim 17, wherein the blocking bump is a rectangle blocking bump.

20. The package structure according to claim 11, wherein the first side surface and the second side surface are approximately at the same plane.

* * * * *